US011423195B2

(12) United States Patent
Jengo et al.

(10) Patent No.: US 11,423,195 B2
(45) Date of Patent: *Aug. 23, 2022

(54) USER INTERFACE TO SIMULATE TARGET DETECTION AND RECOGNITION

(71) Applicant: Goodrich Corporation, Charlotte, NC (US)

(72) Inventors: Christopher M. Jengo, Ayer, MA (US); Suhail Shabbir Saquib, Shrewsbury, MA (US); Matthew Goldstein, Nashua, NH (US); Allan B. Liburd, Worcester, MA (US)

(73) Assignee: Goodrich Corporation, Charlotte, NC (US)

( * ) Notice: Subject to any disclaimer, the term of this patent is extended or adjusted under 35 U.S.C. 154(b) by 417 days.

This patent is subject to a terminal disclaimer.

(21) Appl. No.: 16/133,379

(22) Filed: Sep. 17, 2018

(65) Prior Publication Data
US 2020/0089822 A1 Mar. 19, 2020

(51) Int. Cl.
G06F 3/04847 (2022.01)
G06F 30/20 (2020.01)
G06F 3/04842 (2022.01)

(52) U.S. Cl.
CPC .......... G06F 30/20 (2020.01); G06F 3/04842 (2013.01); G06F 3/04847 (2013.01)

(58) Field of Classification Search
CPC .. G06F 30/20; G06F 3/04842; G06F 3/04847; G06K 2209/21; G06K 9/00671; G06K 9/6253; G06K 9/6288; G06K 9/0063
USPC ....................................................... 342/118
See application file for complete search history.

(56) References Cited

U.S. PATENT DOCUMENTS

| 8,274,377 | B2 | 9/2012 | Smith et al. |
| 8,336,775 | B2 | 12/2012 | Wood et al. |
| 9,734,455 | B2 | 8/2017 | Levinson et al. |
| 10,776,316 | B2 | 9/2020 | Baggeroer et al. |
| 2015/0205760 | A1 | 7/2015 | Hershey et al. |
| 2016/0142700 | A1 | 5/2016 | Grover et al. |
| 2018/0239991 | A1 | 8/2018 | Weller et al. |

(Continued)

OTHER PUBLICATIONS

Extended European Search Report for European Patent Application No. 19197878.2, dated Feb. 10, 2020.

(Continued)

Primary Examiner — Dao L Phan
(74) Attorney, Agent, or Firm — Locke Lord LLP; Joshua L. Jones; Judy R. Naamat

(57) ABSTRACT

A method is disclosed of providing a graphical user interface (GUI) for simulating target detection and recognition. The method includes providing a user entry area for receiving user entered ground truth attributes defining one or more respective simulated physical objects, and providing a user entry area for receiving user entered collection attributes defining one or more collections, each collection being a simulation of automated target recognition applied to simulated sensor output associated with simulated sensing of the one or more simulated physical objects. The method further includes simulating detection of the one or more simulated physical objects and recognition based on the ground truth attributes and the collection attributes, generating detection data about at least one detected object based on the simulated target detection, and displaying the detection data.

20 Claims, 11 Drawing Sheets

(56) References Cited

U.S. PATENT DOCUMENTS

| | | |
|---|---|---|
| 2019/0213285 A1 | 7/2019 | Baggeroer et al. |
| 2019/0215338 A1 | 7/2019 | Baggeroer et al. |
| 2020/0089981 A1 | 3/2020 | Jengo et al. |
| 2020/0089982 A1 | 3/2020 | Jengo et al. |

OTHER PUBLICATIONS

Anonymous: "Automated Driving System Toolbox (TM)—Reference—Matlab R2017b", Jan. 1, 2017 (Jan. 1, 2017), XP055661660, Natick, Massachusetts, U.S.A. Retrieved from the Internet: URL: https://www.mathworks.com/help/releases/R2017b/pdf_doc/driving/driving_ref.pdf [retrieved on Jan. 24, 2020].

Anonymous: "Automated Driving System Toolbox (TM)—Getting Started Guide—Matlab R2017b", Jan. 1, 2017 (Jan. 1, 2017), XP055661740, Natick, Massachusetts, U.S.A. Retrieved from the Internet: URL: https://www.mathworks.com/help/releases/R2017b/pdf_doc/driving/driving_gs.pdf [retrieved on Jan. 24, 2020].

Alexiev, K: "Spatio-Temporal Data Visualization and Analysis for Multi-Target Tracking" In: "Data Fusion for Situation Monitoring, Incident Detection, Alert and Response Management", Jan. 1, 2005 (Jan. 1, 2005), IOS Press, XP055661144, ISBN: 978-1-58603-536-5, pp. 235-252.

Karan, M., et al: "A multisensor single target tracking simulator: MUST", Data Fusion Symposium, 1996. ADFS '96., First Australian Adelaide, SA, Australia Nov. 21-22, 1996, New York, NY, USA, IEEE, US, Nov. 21, 1996 (Nov. 21, 1996), pp. 159-164, XP010216741, DOI: 10.1109/ADFS.1996.581100, ISBN: 978-0-7803-3601-8.

Marlin, Michael J., Wide area search and engagement simulation validation. Air Force Inst of Tech Wright-Patterson AFB OH Dept of Aeronautics and Astronautics, 2007. (Year: 2007).

Ground Truth Objects — 440, 403

| Object | Detected |
|---|---|
| Object #1 | ✓ |

442

False Alarm Objects (1)

Object    308 +

[False Alarm #1]   🗑

Object Information:

Selected: False Alarm — 450
Name: False Alarm #1 — 451
Object Type: [T-72 ▼] — 453

Time of Appearance:
[0] [0] [0] [0]
Days Hours Mins Secs

Time of Disappearance:
[0] [0] [0] [0]
Days Hours Mins Secs

459

Object Location:
[35.688196] [-117.684276]
Latitude   Longitude

460

Confidence: [0.95] — 454
Std. Dev.: [±] [0.01] — 455
Use Geo Uncertainty from Collection:
457 ✓

*Fig. 4B*

USER INTERFACE TO SIMULATE TARGET DETECTION AND RECOGNITION

BACKGROUND OF THE INVENTION

1. Field of the Invention

The present disclosure relates to simulation of target detection and recognition, and more particularly, to simulation of target detection and recognition that uses user input selections and/or stochastic algorithms to simulate behaviors of the simulation.

2. Description of Related Art

Automatic target recognition (ATR) uses sensor data obtained from sensors and applies algorithms to the sensor data to recognize targets or other objects. The output of the ATR can be used not only to recognize a target for a military operation, but for submission to a fusion engine, such as a fusion engine that uses information from multiple ATRs, that have processed data from imagery intelligence (IMINT), signals intelligence (SIGINT), geospatial intelligence (GEOINT), and/or electronics intelligence (ELINT). The fusion engine can provide the integrated information to users for enhanced decision making and/or make decisions and control autonomous operations, such as for conducting further surveillance or combat.

The development and testing of the fusion engine uses output ATR data. It would be desirable to obtain data about potential targets, including potential false targets, under various scenarios and real world situations. It would also be beneficial to obtain such data using different combinations of sensor types, collection conditions, and ATR quality. However, such data is generally limited in availability due to the expense of running exercises with real platforms, sensors, targets, and ATR systems. Additionally, such exercises would typically not be conducted until much later in the development cycle of the fusion engine.

While conventional methods and systems have generally been considered satisfactory for their intended purpose, there is still a need in the art for reliable simulation systems and methods that can simulate target detection and recognition using different input to simulate different scenarios and physical objects that may be targets, and to simulate different sensor types, collection conditions, and ATR quality, without the need to perform actual collection.

SUMMARY OF THE INVENTION

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect, disclosed is a method of providing a graphical user interface (GUI) for simulating target detection and recognition. The method includes providing a user entry area for receiving user entered ground truth attributes defining one or more respective simulated physical objects and providing a user entry area for receiving user entered collection attributes defining one or more collections. Each collection is a simulation of automated target recognition applied to simulated sensor output associated with simulated sensing of the one or more simulated physical objects. The method further includes simulating detection of the one or more simulated physical objects and recognition based on the ground truth attributes and the collection attributes, generating detection data about at least one detected object based on the simulated target detection, and displaying the detection data.

In accordance with embodiments, the method can include outputting the detection data to a processing device that receives detection data as simulated automatic target recognition data and makes autonomous tactical determinations using real or simulated automatic target recognition data.

In accordance with embodiments, displaying the detection data can include displaying the detection data relative to a map of a scenario of the simulation.

In accordance with embodiments, the method can further include providing a user entry area for receiving scenario input. The scenario input can include a map, a region of interest relative to the map, and a time of interest that defines a start and end time for simulation of the target detection.

In accordance with embodiments, the method can further include providing a user entry area for controlling playback of the displayed detection data.

In accordance with embodiments, the user entry area for controlling playback of the displayed detection data can include a user entry area for receiving user enter selections that determine whether or not to display at least one of ground truths defined by the ground truth attributes, detected objects that correspond to the ground truths, and detected objects that are false alarms and do not correspond to the ground truths.

In accordance with embodiments, simulating the target detection can include determining at least one of a geolocation and an object type of each of the detected objects. The detection data can include geolocation data and object type data associated with the detected geolocation and object type, respectively, of the respective detected objects, and displaying the detection data can include displaying at least one of the geolocation and object type of each of the detected objects.

In accordance with embodiments, the method further can further include providing a map interface that streams imagery from the map.

In accordance with embodiments, the map interface can receive user input for selecting a region of interest of the simulation.

In accordance with embodiments, the map interface can include at least a portion of the user entry area for receiving the user entered ground truth attributes.

In accordance with embodiments, the collection attributes associated with one of the collections can include at least one uncertainty attribute. The detection data can include geolocation data associated with a detected geolocation of the respective detected objects. The method can further include randomly determining the geolocation data of one of the detected objects using at least one stochastic algorithm that applies the at least one uncertainty attribute. Furthermore, displaying the detection data can include displaying the detected object using its associated geolocation data.

In accordance with embodiments, the method can further include applying an interpolation function to determine the geolocation associated with at least one respective selected time, wherein displaying the detection data can include displaying the detected object at the at least one selected time using the associated geolocation.

In accordance with embodiments, the at least one uncertainty attribute can include a random error covariance. The method can further include using a geolocation determined in association with a selected time of the at least one selected time to draw at least one sample from a probability distribution that applies the random error covariance to cause the geolocation of the detected object associated with the at least one respective selected time to be generated as a random geolocation.

In accordance with embodiments, the at least one uncertainty attribute can include a bias covariance. The method can further include drawing a zero-mean sample from a second probability distribution that applies the bias covariance, wherein the geolocation generated for the detected object associated with the at least one respective selected time can be randomly offset based on a result of drawing the zero-mean sample.

In accordance with embodiments, the at least one uncertainty attribute can further include a time decorrelation parameter and the collection attributes associated with a collection can indicate whether the simulated sensing by the simulated sensors is single-frame or multi-frame. When the collection attributes associated with the collection indicate that the associated simulated sensing is multi-frame, the method can further include applying an interpolation function to interpolate multiple geolocations of the detected object at different times associated with the collection at uniform time intervals specified by the time decorrelation parameter and using an interpolated position of the multiple interpolated positions to draw the at least one sample from the probability distribution that applies the random error covariance.

In accordance with embodiments, the ground truth attributes can specify an object type in association with the respective simulated physical objects, the collection attributes defining one of the collections can include at least one uncertainty attribute, the detection data can include the detected object type, and the detected objects can be displayed in association with their respective detected object types. The method can further include determining the detected object type by using the at least one stochastic algorithm that applies the at least one uncertainty attribute and categorizing the one of the detected objects as a false alarm when the detected object type of the detected object is different than an object type of the ground truth attributes specified for a corresponding simulated physical object.

In accordance with embodiments, the collection attributes defining one of the collections can include at least one uncertainty attribute. The method can further include determining whether or not one of the simulated physical objects is simulated to be detected based on the at least one uncertainty attribute. Furthermore, displaying the detection data includes only displaying detection data for a detected object if it corresponds to a simulated physical object that was determined to be detected.

In accordance with embodiments, the collection attributes can define a false detection rate. Additionally, the method can further include adding a random number of false detections that do not correspond to information in the ground truth attributes using the at least one stochastic algorithm that applies the false detection rate and assigning the detected object type for each of the false detections to be a randomly drawn object type from an eligibility list of object types indicated to be eligible to be detected by the collection. Furthermore, displaying the detection data can include displaying an object that corresponds to each to the false detections in association with the detected object type assigned for that false detection.

In accordance with embodiments, the method can further include providing a user entry for receiving a user-entered false alarm object to be included in the collection attributes associated with a collection of the one or more collections. The false alarm object may not correspond to simulated detection of any of the one or more simulated physical objects defined by the ground truth attributes. Furthermore, displaying the detection data can include displaying an object that corresponds to the false-alarm object.

In aspects of the disclosure a non-transitory computer readable storage medium is provided that has one or more computer programs stored therein associated with multiple layers of a tactical information system, wherein the computer programs associated with each layer include instructions. When executed by a processor of a computer system, the instructions cause the processor to provide a user entry area for receiving user entered ground truth attributes defining one or more respective simulated physical objects, provide a user entry area for receiving user entered collection attributes defining one or more collections, each collection being a simulation of automated target recognition applied to simulated sensor output associated with simulated sensing of the one or more simulated physical objects, simulate detection of the one or more simulated physical objects and recognition based on the ground truth attributes and the collection attributes, generate detection data about at least one detected object based on the simulated target detection, and display the detection data.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 4B shows an example panel of an embodiment of display information of the GUI shown in FIG. 4A;

DETAILED DESCRIPTION OF THE PREFERRED EMBODIMENTS

Figure 1:
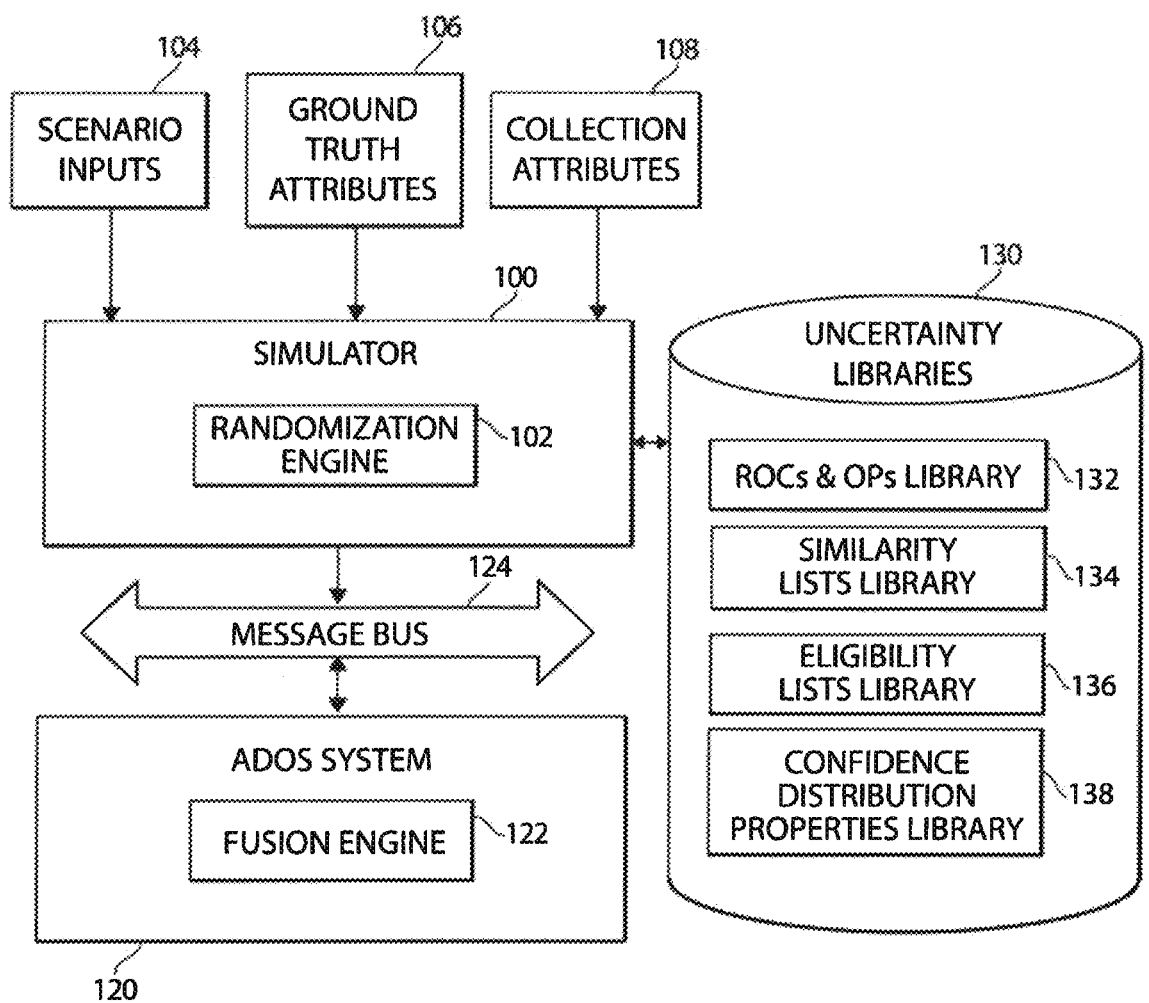
FIG. 1 shows a schematic view of an exemplary embodiment of a simulator in communication with an automated data-to-decision operational services (ADOS) system and uncertainty libraries in accordance with embodiments of the disclosure.

Reference will now be made to the drawings wherein like reference numerals identify similar structural features or aspects of the subject disclosure. For purposes of explanation and illustration, and not limitation, a block diagram of an exemplary embodiment of a simulator in accordance with the disclosure is shown in FIG. 1 and is designated generally by reference character 100. Methods associated with simulation operations of the simulator 100 in accordance with the disclosure, or aspects thereof, are provided in FIGS. 2-10, as will be described. The systems and methods described herein can be used to provide simulation of target detection and recognition.

Simulator 100 is configured to receive scenario inputs 104, ground truth attributes 106, and collection attributes 108. The simulator 100 simulates target detection and automatic target recognition (ATR) using the inputs 104, 106, 108 to simulate different scenarios, physical objects, and detection and recognition of the physical objects. The simulated physical objects are referred to as ground truth objects (GTOs). GTOs that are simulated to be detected and recognized are referred to as detected GTOs or DGTOs. Simulated detections that do not correlate to physical objects are referred to as false alarm objects (FAOs). The term simulated detections refers to recognition as well. Accordingly, DGTOs are objects that have been simulated to be detected and recognized. A collection includes one or more DGTOs or FAOs detected from a simulated ATR run on simulated data that was sensed by a sensor during single frame or multi-frame sensing within a time window. A scenario can have several collections at any given time.

In embodiments, the simulator 100 includes a randomization engine 102 that can apply stochastic algorithms to the ground truth attributes 106 and collection attributes 108 using uncertainty attributes provided via the ground truth attributes 106 and/or collection attributes 108. The uncertainty attributes of the ground truth attributes 106 can include, for example, detection ease of an associated physical object. The uncertainty attributes of the collection attributes can include, for example, sensor uncertainty attributes and automatic target recognition (ATR) performance attributes.

The sensor uncertainty attributes indicate uncertainty of pointing knowledge associated with the simulated sensor used for the collection. The sensor uncertainty attributes can define at least one of covariance of random error and/or bias components and a time decorrelation parameter.

The ATR performance attributes indicate an uncertainty associated with determination of the target type and the detection confidence. The ATR performance attributes can define true detection and/or false alarm rates. The uncertainty attributes can further include a similarity list of similar object types, such as in the form of a taxonomy. The randomization engine 102 can randomly select objects for detection from the GTOs that are eligible for detection, and can further randomly select an object type of a DGTO from a similarity list of object types.

The randomization engine 102 can access an uncertainty library 130 that stores uncertainty information. The uncertainty library 130 can include one or more non-volatile storage devices that can be external to the simulator 100 or included internally with the simulator 100. In the example shown, the uncertainty library 130 can include sub-libraries of uncertainty information, including receiver operating characteristics (ROCs) and operating points (OPs) library 132, similarity lists library 134, eligibility lists library 136, and/or confidence distribution properties library 138. The uncertainty attributes associated with a collection can identify a specific ROC or OP available in the ROCs and OPs library 132. The uncertainty attributes associated with a GTO can identify a similarity list or a relevant portion of a similarity list, such as a branch of a taxonomy.

The simulator 100 provides a graphical user interface (GUI) that can be operated to select or adjust the inputs 104, 106, 108. Adjustments to the uncertainty attributes adjust behavior of the sensing (including detection by sensors) and recognition processes performed by the simulated sensors and ATR. The GUI can further output a display of the DGTOs and FAOs, including their geolocations and object types and associated geo-uncertainty (uncertainty of the determined geolocation) and confidence (confidence of the determined type that can be represented by a value, referred to as confidence value). The GUI can display markers to depict the GTOs, the DGTOs, and the FAOs for each collection. Accordingly, the simulator 100 can simulate different sensor types, collection conditions, and ATR quality, without the need to perform actual collection.

The simulator 100 can further output information about the generated DGTOs and FAOs for each collections via a message bus 124 to a fusion engine 122 that can be included with an automated data-to-decision operational services (ADOS) system 120. U.S. Pat. Nos. 15,863,458; 15,863,643; and 15,863,676 describe an ADOS system and fusion engine and are incorporated by reference herein in their entirety. The fusion engine 122 receives data from multiple ATRs and fuses the data that is determined to be associated with the same target. The ADOS system 120 manages tasks such as collection of the data from the multiple ATRs and determining whether the output from the fusion engine 122 satisfies a fusion confidence level. When the output from the fusion engine 122 does satisfy the fusion confidence level, the ADOS system 120 can notify other components of the system that a target has been located, such as for tracking or engaging the target. Accordingly, the ADOS system 120 can receive the messages output by the simulator 100 and use these messages to output notify components of the system, such as an aircraft, that a target has been located. The ADOS system 120 can use the messages output by the simulator 100 to track, engage, or assess the target that has been located.

The operation of the ADOS system 120 can be tested using the messages output by the simulator 100. For example, the ADOS system 120 can be tested when it receives information about FAOs from the simulator 100 to see if it can determine that the FAOs are not actual targets or are assigned a wrong target type. Furthermore, the ADOS system 120 can be tested when it receives information about GTOs and to test how it treats the GTOs, such as for instructing aircraft to track, engage, or assess the GTOs.

While the simulator 100 is described in the context of simulation of detection and recognition of stationary or moving DGTOs and FAOs on the ground for military reconnaissance and/or planning of operations, the simulator 100 can be used for different applications and contexts. The simulator can also be used to simulate input to commercial and/or military air and seacraft services that utilize inputs from multiple sensors to fuse and track multiple targets. For example, maritime vessels (including submarines) may be detected by visual means, imaging (passive and/or active), radar, sonar, detection of electronic emissions, ship transponders, and so on. The simulator can assist in the development of fusion services that utilize one or many of these sensor types with associated ATRs by providing a rich set of complex scenarios for which it would be cost prohibitive, impracticable, and in certain scenarios substantially impossible, to gather real test data.

Figure 2:
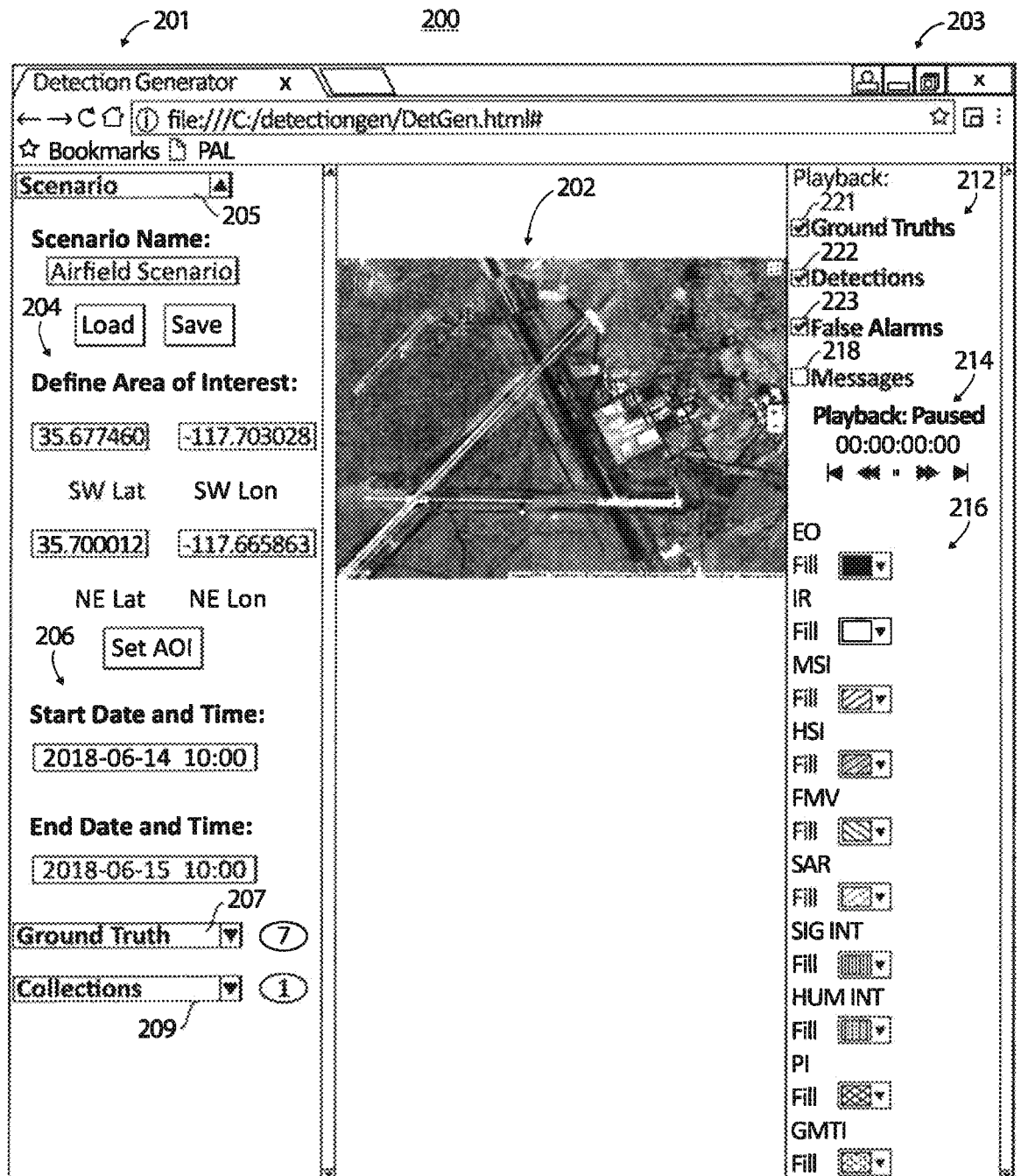
FIG. 2 shows example display information of a scenario/playback portion of a graphical user interface (GUI) provided by the simulator in accordance with embodiments of the disclosure.

FIG. 2 shows example display information of a scenario/playback portion 200 of a GUI that can be used for entering the scenario inputs 104. The scenario/playback portion 200, selected by operation of tab 205, is shown to have a map 202 that is flanked by a left side panel 201 and a right side panel 203. The user can enter scenario inputs 104 via the GUI 200 to specify an area of interest (AOI) and a time interval of interest (TIOI) at which the simulation shall take place. Tab 207 can be operated to navigate to a ground truths portion 300 of the GUI shown in FIG. 3, and tab 209 can be operated to navigate to a collections portion 400 of the GUI shown in FIGS. 4A and 4B.

In the example shown, the AOI is designated using geolocations to describe a real world location area, such as by using geographic coordinates (latitude, longitude). The real world location area can be described relative to the map 202 that is provided as input to the simulator 100. The map 202 can be a live streaming map, e.g., Google Maps, Google Earth Enterprise Server, or another image map interface. The AOI area can be selected by interacting with the map 202 via the GUI or by inputting two or more geographic coordinates, such as at interactive AOI fields 204 that describe the AOI. For example, the user can define the AOI by specifying the latitude and longitude of Southwest and Northeast corners of the AOI. Alternatively, the user can use a pointing device (e.g., mouse or touch screen) to drag a position indicator along the map to a location of their choosing, zoom in and out, and to select a location to be a boundary of the AOI, e.g., by clicking a button of the mouse. In other applications, the location area can be designated using a different type of map or coordinate system.

In the example shown, the TIOI is specified by entering a start time (expressed as date and time of day) and an end time in interactive TIOI fields 206 that describe the start and finish times of the TIOI. Information about GTOs and collections can be viewed at fields 208.

The right side panel 203 shows playback selection field 212, playback operation field 214, and playback color field 216 that are associated with playback of a simulation that was previously designed. Message selection field 218 can be operated to select whether or not to transmit messages to the fusion engine 122, wherein the messages include the output of the simulation. In embodiments, the messages typically do not include the raw data collected by the sensor but only metadata of the collection such as time of collection, sensor modality (whether the sensor is sensing visible light, radar frequencies, spectral content etc.) and outputs of the ATR for each detected objects such as their geo-location and uncertainty, detected object type and the associated confidence of the detection.

At sensor display control section 216 the user can select colors to be used for different sensor types. Each collection has a specified sensor type. Examples of sensor types include, without limitation, electro-optical (EO), Synthetic Aperture Radar (SAR), infra-red (IR), Hyper Spectral Imager (HSI), Multi-Spectral Imager (MSI), full motion video (FMV), signals intelligence (SIGINT), human intelligence (HUMINT), Persistent Imaging (PI), and ground moving target indicator (GMTI).

The simulator 100 allows a user to save scenarios and load pre-existing scenarios, which allows simulations to be modified and re-run at a later time. The playback feature further allows the user to execute the simulation scenario. The user can use checkboxes in playback selection field 212 to select whether or not the playback should display GTOs, DGTOs, and FAOs during playback. For example, in order to only see what the simulation detected and recognized, the user can uncheck the ground truths selection 221 to hide GTO markers that correspond to GTOs from the playback and check the detections selection 222. In another example, in order to hide false alarm markers that mark FAOs from the playback, the user can uncheck the false alarms selection 223. In still another example, in order to hide DGTO markers that mark DGTOs from the playback, the user can uncheck the detections selection 222.

The user can operate buttons of the playback operation field 214 to play, pause, fast forward, rewind, and restart the playback of the simulation. An executed simulation can thus be replayed and reviewed. The simulation can also be executed multiple times, each time resulting in different results due to the randomization algorithms used. For algorithm debugging purposes, a special mode of the simulator may be included that allows for the simulation results to be repeatable when the simulation is executed multiple times. This can be achieved by fixing the seed of the random number generator used in the simulator.

Figure 3:
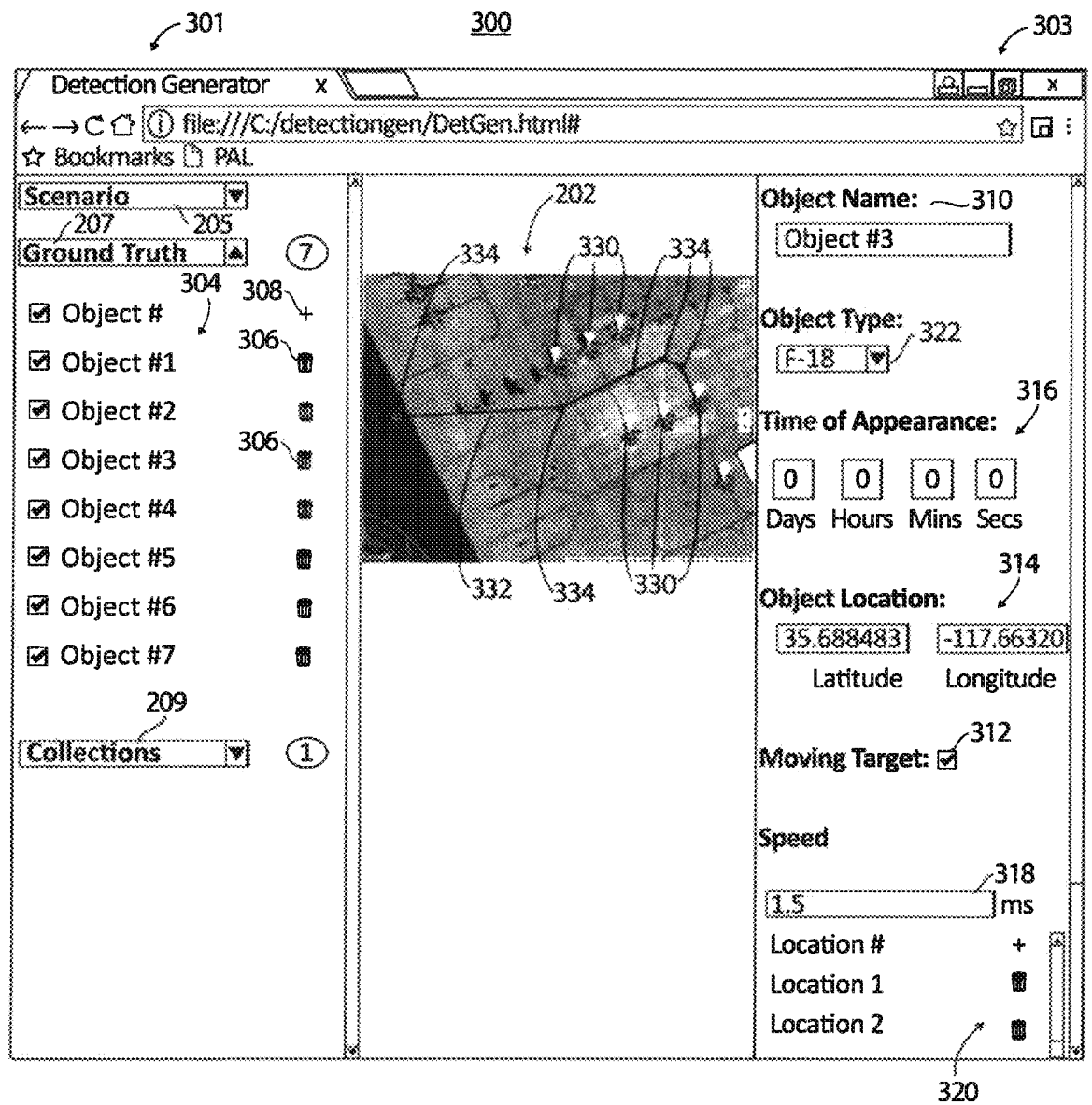
FIG. 3 shows an example display information of a ground truth portion of a GUI provided by the simulator in accordance with embodiments of the disclosure.

Upon operation of the ground truths tab 207, the ground truths portion 300 shown in FIG. 3 is displayed. At a left panel 301 of portion 300 a list of GTOs 304 currently entered is provided. The user can delete GTOs (e.g., by operating a deletion icon 306 associated with the GTO) or add a GTO (e.g., by operating an addition icon 308). A right panel 303 of portion 300 shows ground truth attributes 106 (shown as input to the simulator in FIG. 1) that define a GTO selected from the list of GTOs 304 in the left panel 301. When authorized, the user can enter or edit the ground truth attributes 106 shown in right panel 303.

The GTO can be identified by a user selected name, which can be entered and displayed in input name field 310. The user can specify whether the GTO is stationary or moving via input movement field 312. The user can further enter the location of a GTO that is being added by selecting a physical object that is already included in the map, selecting a location on the map (with no corresponding object), or manually entering location data into location input fields 314. An object or location can be selected by dragging a GTO marker 330 to that location. A selected location is displayed in location input fields 314 and included with the GTO's ground truth attributes 106.

For a stationary GTO, time information in time input fields 316 can specify a time of appearance and/or a time of disappearance from a location specified in location input fields 314. The time information can be relative to a reference point, such as the beginning of the time interval of the scenario.

For a moving GTO, the location specified in location input fields 314 indicates a starting location. Speed information specified in speed input field 318 can specify a speed of the GTO. A series of locations specified in series location input field 320 can specify a series of locations on the map selected by adding GTO markers 330 for the GTO to the map. A time that the GTO is located at each of these added GTO markers 330 can be automatically calculated based on the distance between GTO markers 330 and the specified speed. Alternatively, a time can be specified for the respective GTO markers 330 and the speed of the GTO between the respective GTO markers 330 can be calculated. Placement of the GTO markers 330 on the map can be performed by dragging a GTO marker 330 to a selected location on the map or by manually entry of latitude and longitude. A path of movement 332 for a particular GTO can be designated and displayed by dragging its associated GTO marker 330 along a selected path between different locations 334, and indicating either a speed of movement or a time the GTO arrived at each location.

A GTO type is entered in type input field 322 to specify a type of the GTO. Examples of types include aircraft, tank, truck, F-18, etc.

Figure 4A:
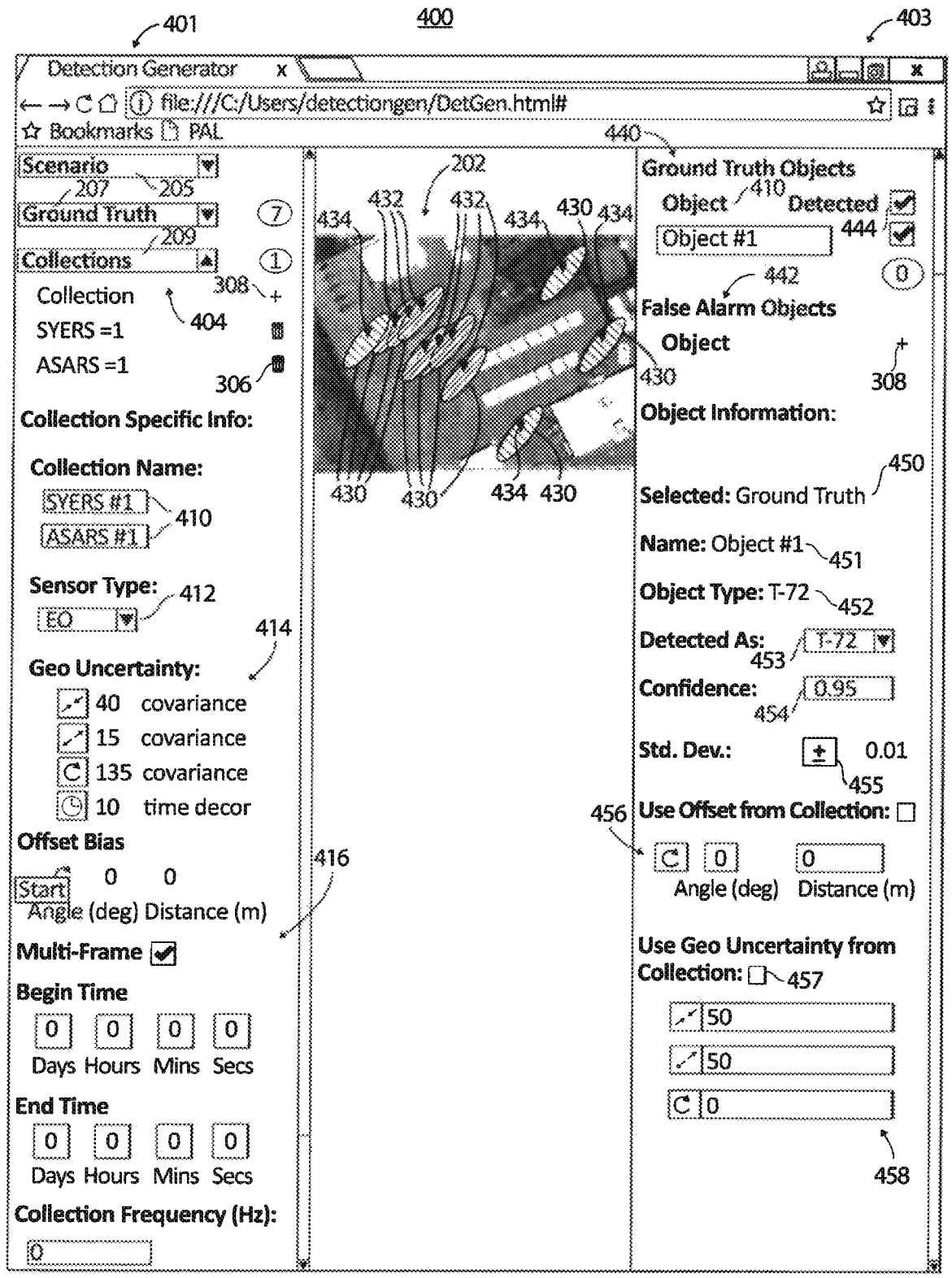
FIG. 4A shows an example display information of a collections portion of a GUI provided by the simulator in accordance with embodiments of the disclosure.

Upon operation of the collections tab 209, collections portion 400 shown in FIGS. 4A and 4B is displayed. At a left panel 401 of portion 400 a list of collections 404 currently entered is provided. Each collection simulates both a sensor collecting raw data and an ATR system receiving the raw data and detecting objects of interest based on the raw data. The user can delete collections (e.g., by operating a deletion icon 306 associated with the collection) or add a collection (e.g., by operating an addition icon 308). The left panel 401 further shows collection attributes 108 input to the simulator 100 (as shown in FIG. 1) that define a collection that is selected from list of collections 404. When authorized, the user can enter or edit the collection attributes 108 shown in left panel 401.

When a collection is selected, all the DGTOs and FAOs associated with that collection are displayed graphically using makers 430 on the map. The selected collection can be identified by a user selected name, which can be entered and displayed in field 410. The input collection attributes 108 displayed and available for editing includes sensor type at sensor input field 412, uncertainty attributes at uncertainty input field 414, and frame attributes at frame input field 416. The sensor type indicates a type of simulated sensor that performs sensing associated with the collection. The uncertainty attributes include geo-uncertainty in the pointing knowledge of the sensor that can be divided into a random and a bias component. These geo-uncertainties can be specified by the user as either covariance matrices or the major/minor axes and the orientation of the uncertainty ellipse. For multi-frame collections, the user can also specify a time decorrelation parameter. How the random/bias components and the time decorrelation is used in the randomization engine is described in further detail below.

The frame attributes indicate a time window for the collection and whether the corresponding collection includes multiple frames (designated as multi-frame) or a single static frame. For single-frame collections, frame input fields 416 include fields for the user to specify a time window with a single time at which the frame was acquired. For multi-frame collections, frame input fields 416 specify a time window that defines a start and end time when the frames of the collection were acquired as well as a collection frequency that indicates the frequency at which the multiple frames were acquired. All times are relative to a reference time. In the example shown, the reference time is the beginning of the scenario.

The right panel 403 of the collections portion 400 includes information about the selected collection's detections, including a GTO list 440 of detected ground truth objects and an FAO list 442 of false alarm objects. The detections are also displayed on the map 202, as described in further detail below. Additionally, data about the detections can be included in executed simulations, playback of executed simulations, and/or output as messages to the ADOS system 120 shown in FIG. 1.

The GTO list 440 includes a list of the GTOs that are candidates to be detected by the simulated target detection because they have a time of appearance (as entered in time input fields 316 of FIG. 3) that is included within the time window of the collection. In embodiments, the GTO list 440 provides a detection entry checkbox 444 associated with each GTO listed. In accordance with these embodiments, only the GTOs whose associated detection entry checkbox 444 is checked are available to be detected during the simulation (and referred to as DGTOs) within that collection. When the checkbox is not checked for a GTO, the user has determined that the GTO should be incorrectly not detected during the simulation. This type of incorrect lack of detection simulates a false negative or a missed detection. The rate at which these false negatives are produced depends on the detection rate of the ATR/sensor combination and is specified by the user. The simulator 100 uses the detection rate information to simulate the stochastic behavior of the sensors and/or ATR as will be described in further detail below.

Information about a selected GTO of the GTO list 440 is displayed in object information fields 450-458. Selected field 450 (a non-editable field) indicates whether the selected object is a GTO selected from GTO list 440 or an FAO selected from FAO list 442. In the example shown, the selected object is a GTO that is detected, and is therefore a DGTO. Name field 451 (a non-editable field) displays the name of the selected GTO as entered in portion 300, name input field 310 of FIG. 3. The object type field 452 (a non-editable field) displays the object type as entered in portion 300 in the type input field 322 of FIG. 3.

In embodiments, the detected type field 453 (an editable field) allows the user to enter an object type that can be the same or different than the object type displayed in the object type field 452 that was originally entered for the selected GTO using type input field 322. In these embodiments, when the object type entered in detected type field 453 is different than the object type displayed in the object type field 452, the user has determined that the selected GTO is detected, but its type is incorrectly recognized. This type of incorrect recognition simulates a type of false alarm generated by the simulated sensors and/or simulated ATR. This type of false alarm is a false positive as the object identified by the ATR is not actually present in the scene. The simulator 100 uses the detection and false alarm rate entered by the user to simulate the stochastic behavior of the sensors and/or ATR as will be described in further detail below.

The confidence field 454 (an editable field) indicates a confidence value that represents confidence in the detection. In embodiments, the confidence field 454 is editable and the user can enter a value for the confidence value that is indicative of stochastic behavior of the sensors and/or ATR. The standard deviation field 455 (an editable field) allows the user to specify whether the confidence for the detection will be deterministic and fixed to the value specified in field 454 or stochastically generated by the randomization engine 102. A value of zero for the standard deviation indicates the confidence remains fixed for the collection. A positive non-zero value indicates the variation of the confidence value with respect to the value specified in field 454. In this case, a probability distribution such as a Gaussian will be employed to stochastically generate the confidence value. Field 454 and 455 specify the mean and standard deviation respectively of the probability distribution. Alternatively, these parameters of the probability distribution may be selected from the uncertainty library 130 based on whether the detection is a DGTO or a FAO.

The use-collection-uncertainty checkbox fields 457 provide the user with the choice to enter uncertainty attributes for the selected GTO or to use uncertainty attributes entered at uncertainty input field 414 of portion 400 in FIG. 4. When the use-collection-uncertainty checkbox fields 457 are not checked, the user has selected to enter uncertainty attributes into the object offset field 456 (an editable field) and the object geo-uncertainty field 458 (an editable field) for the selected GTO. When the use-collection-uncertainty checkbox fields 457 are checked, the user has selected to use the uncertainty attributes entered at uncertainty input field 414 of portion 400 in FIG. 4A, and object offset field 456 and object geo-uncertainty field 458 are omitted and not displayed in right panel 403.

The geolocation of the DGTO (the currently selected GTO that is detected) is determined using a stochastic algorithm explained in greater detail below. The stochastic algorithm can use at least one of a covariance of random component, a covariance of bias component, and/or a time decorrelation parameter described in fields 414 or 456 and 458. The stochastically determined geolocation can be output to the GUI to display the DGTO on the map 102 and/or output in messages to the ADOS 120. A geolocation is not determined for a GTO that is not selected.

In accordance with embodiments of the simulator 100, FIG. 4B shows a view of the side panel 403 when the selected object is an FAO selected from the FAO list 442 or being added as an FAO. In these embodiments, the user can use the addition icon 308 to add an FAO. Additionally, the user can enter data in fields 451, 453, and 454-460 of the object information fields to describe or edit each FAO as it is entered or selected. These FAOs do not correspond to a GTO, but rather represent randomly generated false alarms, such as due to the ATR triggering on some pattern in raw data and imagery that is similar in some respect to objects of interest. The detection and recognition of an object that does not correspond to a GTO simulates a type of false alarm caused by the simulated sensors and/or simulated ATR. This false alarm is a false positive. The simulator 100 uses the false alarm rate information entered by the user to simulate the stochastic behavior of the sensors and/or ATR as will be described in further detail below.

Fields 440, 442, 444, 308, and 306 shown in FIG. 4B are substantially the same as the corresponding fields shown in FIG. 4A and are not described here in order to avoid repetition. The object information fields that are displayed include fields 450, 451 and 453-460. Fields 450, 451, and 454-458 are substantially the same as the corresponding fields shown in FIG. 4A and are not described here in order to avoid repetition.

In embodiments, the object type field 452 is omitted. The detected type field 453 is an editable field in which the user can input an object type for the selected FAO. Time fields 459 (editable fields) can be used by the user to enter a time of appearance and a time of disappearance of the selected FAO, provided these times overlap with the time window of the collection. Location fields 460 (editable fields) can be used by the user to enter a geolocation of the FAO. The user can enter a confidence value at confidence field 454 that indicates a simulated confidence value of the selected FAO. Alternatively, the confidence value of the FAO may be stochastically generated by the randomization engine 102 as described for FIG. 4A.

The detected objects in a collection (DGTOs and FAOs) are displayed on the map 202 shown on portion 400. Each detection is designated by a DGTO marker 432 that marks DGTOs or an FAO marker 434 that marks FAOs. The DGTO markers 432 and FAO markers 434 are graphically distinguished. An ellipse 430 surrounding each marker 432 or 434 can graphically indicate the geo-uncertainty associated with that detection, such as by color or shading. Additionally, a correspondence can be graphically indicated between each GTO and its corresponding DGTO, including a graphical indication when they have different object types, such that the DGTO is a false alarm. One skilled in the art will understand that the portions 200-400 of the GUI are illustrative and provided by way of example. Information described as being input to the simulator can be input by a user or processor with or without a GUI. The portions 200-400 can be designed with the map 202 or without the map 202. The tabs, information provided per portion, fields, layout of the portions, map, markers, etc. of the GUI use alternative designs that are within the scope of the disclosure.

In addition to, or alternatively to providing input fields for the user to emulate stochastic behavior of the simulated sensor and/or ATR, such as by entering false alarm objects and/or confidence values (e.g., per GTO and/or FAO, or per collection), the randomization engine 102 can apply stochastic algorithms when simulating the sensors and/or ATR.

Regarding the stochastic behavior of the simulated sensors, the geolocation determined for a DGTO or FAO is based on pointing knowledge of the simulated sensor and its platform when raw data is being collected. This pointing knowledge can be uncertain, such as due to measurement noise, sensing precision, and calibration errors. For example, a sensor on an airborne platform is subject to turbulence and jitter while collecting data, which can affect precision of determination of a true location at which the sensor was pointing. This gives rise to random errors in the geolocation of the detection, such that repeated detections of the same object by the same sensor can result in the random variations in the geolocations determined for the detection. In addition, factory calibration errors in the construction of a simulated sensor may lead to a fixed bias in the geolocation. Such bias can manifest itself as a fixed offset in the geolocation of the data collected, such as in the geolocation of objects in collected images.

The randomization engine 102 models both of these kinds of errors by stochastically generating a geolocation of DGTOs using a probability density distribution, e.g., a Gaussian distribution. Other distributions known to those skilled in the art such as the uniform distribution may also be employed. The mean for the Gaussian distribution is set to the true location of an object of interest at the time instance it was first detected, which is provided in location input fields 314 in FIG. 3 for GTOs and location field 460 in FIG. 4B for FAOs. Additionally, the randomization engine 102 receives input covariances for random and bias components of the Gaussian distribution from fields 414 or 456-458 in FIG. 4A. In embodiments, the geo-location of a FAO is directly specified by the user in field 460 of FIG. 4B or stochastically generated by the randomization engine 102 using a uniform distribution that spans the entire area collected by the sensor. The latter is employed when the randomization engine automatically generates FAOs based on the false alarm rate of the sensor/ATR combination as will be described in further detail below.

The geolocation determined for a DGTO is randomly generated using an additive mixture of a sample drawn from the random component and a sample drawn from the bias component. The sample from the bias component can be drawn once for a particular sensor and then kept constant for all the DGTOs and FAOs included within that collection. In embodiments, the sample from the bias component may change from one collection to another even when the collections are associated with the same sensor, which models a scenario where the bias is introduced in an internal coordinate frame of the sensor. Consequently, the bias may manifest itself differently on the ground every time the sensor looks in a different direction. In embodiments, the sample from the bias component may remain constant across all collections associated with that sensor.

The covariance of the random component can be specified once for the entire collection, as indicated by selection of checkbox 457 in FIGS. 4A and 4B, or alternatively it may be specified separately for each DGTO or FAO included in the collection.

A physical system with inertia generally does not move randomly within extremely small time intervals. The inertia imposes limits on motion bandwidth of the physical system in time. To simulate this aspect of physical systems, the user can specify a time decorrelation parameter for each sensor/platform. The geolocation of DGTOs that are repeatedly detected in simulated multi-frame collections can be smoothed over time using the time decorrelation parameter.

An example of a method to generate the random locations for the DGTOs or FAOs detected within a multi-frame collection that spans a certain time period is now described.

Let i denote an index assigned to a multi-frame collection associated with a specific sensor and platform.

Let j denote an index of a particular object (e.g., a DGTO) detected within the collection, also referred to as a detection.

Let $\vec{p}_{jt}$ denote a location vector of object j at time instance t. If the object is stationary, then the location vector is independent of time t, i.e., $\vec{p}_{jt} = \vec{p}_j$.

If the object is moving, input provided to the method, such as via user input or from another processor, can specify a location of the moving object at discrete time instances $(t_1, \ldots, t_k)$. The location at any time t can be obtained by an interpolation function $I(\cdot, \cdot)$, as follows:

$$\vec{p}_{jt} = I(t | \{\vec{p}_{jt_1}, \ldots, \vec{p}_{jt_k}\})$$

The first argument to the interpolation function is the time instance t at which the location vector is required, and the second argument includes respective locations of the object at the specified discrete time instances.

Let $\tau_i$ denote a time decorrelation parameter for the multi-frame collection i. Let $\{t_1, \ldots, t_n\}$ denote a set of time instances that are equi-spaced by a time interval, wherein the time interval between adjacent time instances is $\tau_i$. The time instances in this set can be generated as:

$$t_n = t_1 + (n-1)\tau_i$$

A location of the object can then be interpolated on the uniformly spaced time grid as follows:

$$\{\vec{p}_{jt_1}, \ldots, \vec{p}_{jt_n}\} = \{I(t_1 | \{\vec{p}_{jt_1'}, \ldots, \vec{p}_{jt_k'}\}), \ldots, I(t_n | \{\vec{p}_{jt_1'}, \ldots, \vec{p}_{jt_k'}\})\}$$

Let $N(\mu, \Sigma)$ denote a Gaussian with mean and covariance $\Sigma$. When $N(\cdot, \cdot)$ is used in an expression, it denotes a value of a random sample drawn from that distribution. In a convention used, bold case denotes randomly generated quantities.

A sample can be drawn from the bias component to randomly generate the bias $\vec{\Delta p}_i$ that is applied to the locations at different respective time instances, as follows:

$$\vec{\Delta p}_i = N(0, \Sigma_{b_i})$$

where $\Sigma_{b_i}$ denotes the covariance of the bias component of collection i. It is noted that the bias is independent of the object j and time t during the multi-frame collection i.

The set of true locations $\{\vec{p}_{jt_1}, \ldots, \vec{p}_{jt_n}\}$ can then be converted to random locations using a sample drawn from the random component, as follows: $\vec{p}_{jt_n} = N(\vec{p}_{jt_n}, \Sigma_{r_{ij}})$ where $\Sigma_{r_{ij}}$ denotes the covariance of the random component for collection i and object j. In embodiments, the component is independent of object j and only depends on the collection i. In embodiments, the random component varies as a function of location of the object.

The final random location of the detect for object j at any time instant t during a particular frame of the multi-frame collection i can then be obtained by applying the interpolation function to the set of random locations on the uniformly spaced grid and adding the bias component, as follows:

$$\vec{p}_{jt} = \vec{\Delta p}_i + I(t | \{\vec{p}_{jt_1}, \ldots, \vec{p}_{jt_n}\})$$

For single-frame collections that have a time interval much greater than the time decorrelation parameter between them, the smoothing over time is not necessary. In this particular case, the random location of the detection that corresponds to object j and time t in the collection i can be directly obtained using:

$$\vec{p}_{jt} = \vec{\Delta p}_i + N(\vec{p}_{jt}, \Sigma_{r_{ij}})$$

where $\vec{\Delta p}_i$, in this example, is only generated once and applied to all the objects in the collection.

With reference now to FIGS. 5, 6, 8, and 9, shown are flowcharts demonstrating implementation of the various exemplary embodiments. It is noted that the order of operations shown in FIGS. 5, 6, 8, and 9 is not required, so in principle, the various operations may be performed out of the illustrated order or in parallel. Also certain operations may be skipped, different operations may be added or substituted, or selected operations or groups of operations may be performed in a separate application following the embodiments described herein.

Figure 5:
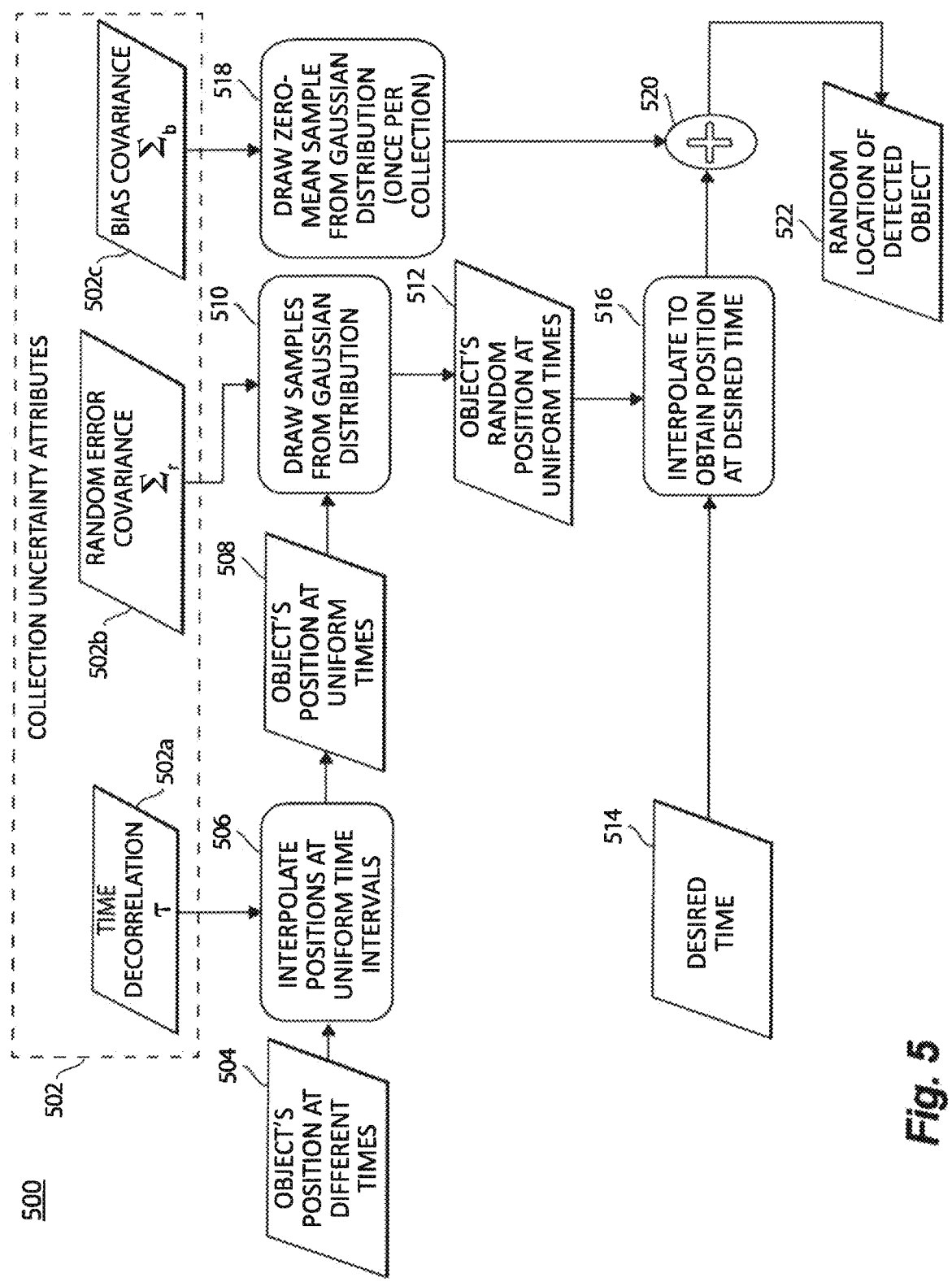
FIG. 5 shows a flowchart of an example method of stochastically determining a geolocation of a detected object that is sensed using a multi-frame collection, in accordance with embodiments of the disclosure.

FIG. 5 shows a flowchart 500 of an example method of stochastically determining the geolocation of a detected object, such as a DGTO, that is sensed using a multi-frame collection. Uncertainty parameters 502 are received, wherein the uncertainty parameters can be specific to a collection of the object or to the object. The parameters 502 include a time decorrelation parameter $\tau$ 502a a random error covariance $\Sigma_r$ 502b and a bias covariance $\Sigma_b$ 502c. The object's position at different times 504 is received, such as via fields 314, 318, and 320 of FIG. 3. At operation 506 an interpolation function is applied to interpolate positions of the object at uniform time intervals defined by the time decorrelation parameter τ. The output 508 includes the object's position at uniform times and is provided as input to a process performed at operation 510.

At operation 510, samples are drawn from a Gaussian distribution that uses the objects position at uniform times as the mean and a random error covariance $\Sigma_r$. Output from operation 510 includes the object's random position at uniform times, which is provided as input to a process performed at operation 516. Additionally, a desired time 514 is provided as input to operation 516. The desired time 514 can be input from the playback function of the scenario. At operation 516, an interpolation function is applied to the object's random position at uniform times 12 and the desired time 514.

At operation 518, a zero-mean sample is drawn from the Gaussian distribution using the bias covariance $\Sigma_b$. In embodiments, operation 518 can be performed once per collection. At operation 520 the output of operations 516 and 518 are summed and output as a random location of the detected object 522 at the desired time. The location of the detected object 522 can be output by displaying the detected object at the determined random location on the map 202 during playback, and/or transmitting the output to the ADOS system 120 via a message in association with the detected object being processed.

Figure 6:
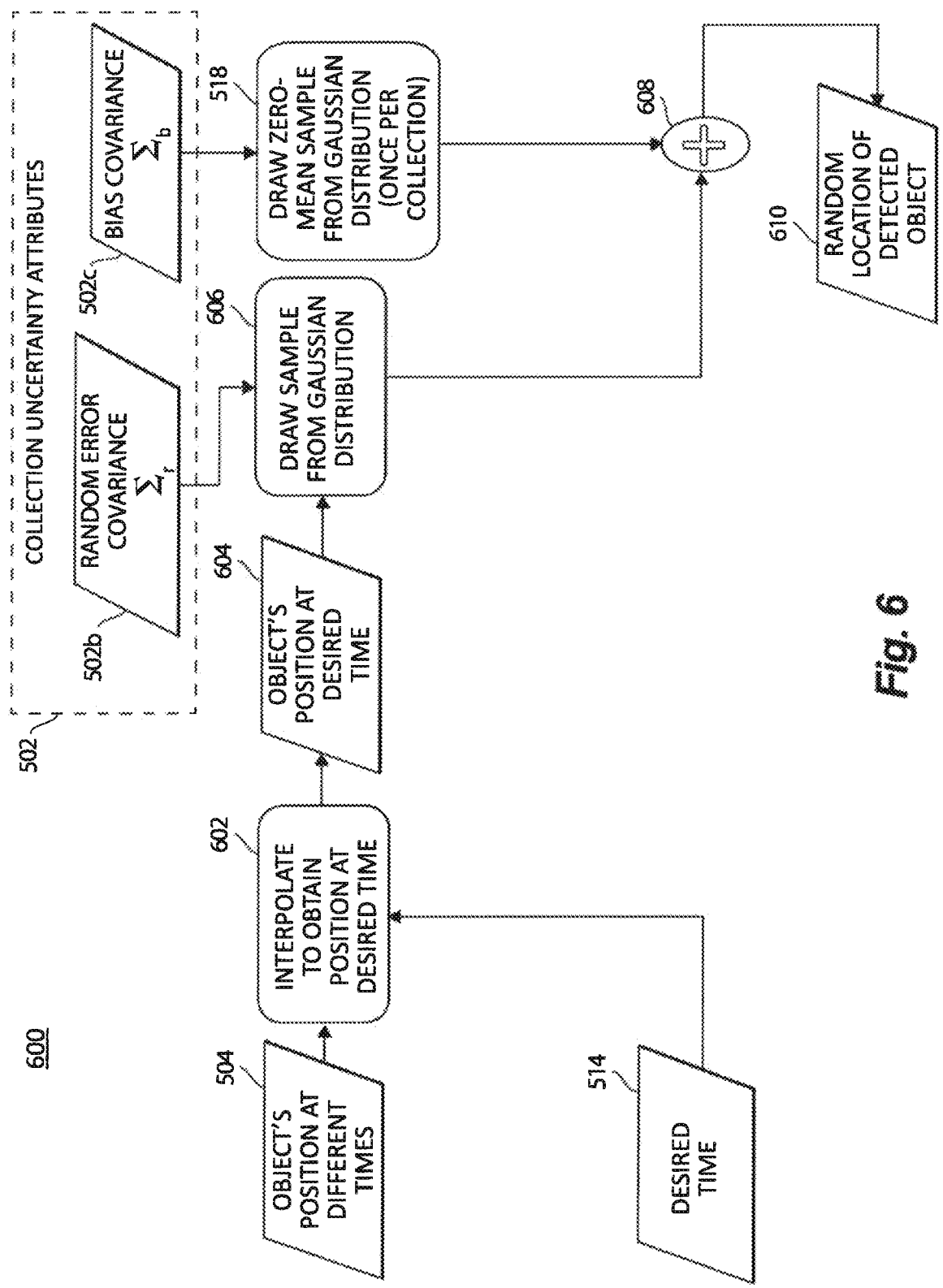
FIG. 6 shows a flowchart of an example method of stochastically determining a geolocation of a detected object that is sensed using a single frame collection, in accordance with embodiments of the disclosure.

FIG. 6 shows a flowchart 600 of an example method of stochastically determining the geolocation of a detected object, such as a DGTO, that is sensed using a single frame collection. Inputs 502b, 502c, 504, and 514, and operation 518 are substantially the same as described with respect to FIG. 5. Uncertainty parameters 502 are received, wherein the uncertainty parameters 502 can be specific to a collection of the object or to the object. The parameters 502 include a random error covariance $\Sigma_r$ 502b and a bias covariance $\Sigma_b$ 502c. The object's position at different times 504 is received, such as via fields 314, 318, and 320 of FIG. 3. A desired time 514 is received, such as from the playback function of the scenario. At operation 602, an interpolation function is applied to the object's input position at different times 504 and the desired time 514. The output of operation 602 that includes the object's position at the desired time 604 is provided as input to a process performed at operation 606.

At operation 606, samples are drawn from a Gaussian distribution that uses the objects position at the desired time as the mean and a random error covariance $\Sigma_r$. At operation 518, a zero-mean sample is drawn from the Gaussian distribution using the bias covariance $\Sigma_b$. In embodiments, operation 518 can be performed once per collection. At operation 608 the output of operations 606 and 518 are summed and output as a random location of the detected object 610 at the desired time.

The location of the detected object 610 can be output by displaying the detected object at the determined random location on the map 202 during playback, and/or transmitting the output to the ADOS system 120 via a message in association with the detected object being processed.

In embodiments, at least one stochastic algorithm is used to simulate stochastic behavior of the sensors and/or ATR for determining the occurrence of false alarms or missed detections. These embodiments eliminate at least one of the GUI fields described above that allow a user to simulate the stochastic behavior of the sensors and/or ATR, including detection entry checkbox 444 in FIGS. 4A and 4B, editable input field 453 for entering a DGTO's object type and the associated editable confidence field 454, addition icon 308 for adding FAOs in FIGS. 4A and 4B, and the right sight panel 403 shown in FIG. 4B.

The stochastic algorithms emulate an ATR's tradeoff between a true detection rate and a false alarm rate. The stochastic algorithms further take into account randomness of ATR behavior for determining an object type and a confidence of a detection.

In these embodiments, the randomization engine 102 receives additional uncertainty attributes for the respective collections. The additional uncertainty attributes can be included with the particular collection's attributes. Fields for entering these additional uncertainty attributes can be provided with the left side panel 401 of portion 400 shown in FIG. 4A. The additional uncertainty attributes of the collection attributes include true detection rate $d_i$ and the false alarm rate $f_i$ of the ATR. The true detection rate $d_i$ and the false alarm rate $f_i$ can be specified by identifying an ROC and an operating point of the ROC, such as by inputting an ROC and/or operating point, and/or selecting an available ROC and/or operating point from the ROCs and OPs library 132.

Figure 7:
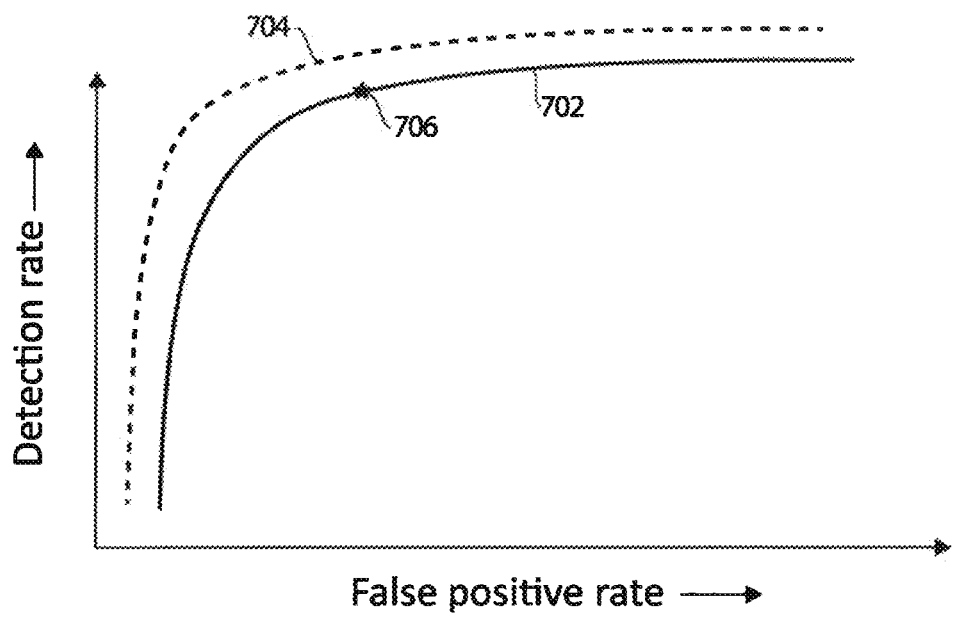
FIG. 7 shows a graph of example receiver operating characteristic (ROC) curves associated with an ATR.

FIG. 7 shows a graph 700 of an example first receiver operating characteristic (ROC) curve 702 associated with an ATR, which illustrates quantification of the trade-off between true detection rate $d_i$ and false alarm rate $f_i$. As the true detection rate $d_i$ increases, the false alarm rate $f_i$ also increases. A second example ROC curve 704 is shown to illustrate behavior of an ATR that has improved performance relative the behavior illustrated by the first ROC curve 702. An operating point 706 along the first ROC curve 702 is shown. In embodiments, true detection rate $d_i$ and/or false alarm rate $f_i$ can be randomly generated.

Let $m_i$ denote the total number of eligible objects that are eligible for detection in collection i. Determination of $m_i$ can based on the number of objects included in the GTO list 440 shown in FIG. 4A, which lists the GTOs that have a time of appearance (as entered in time input fields 316 of FIG. 3) that is included within the time window of the collection i. The GTOs included in the GTO list can further be limited to eligible objects that have an object type that is capable of being detected by the type of sensor used by collection i. The randomization engine 102 can include logical rules that can be used to determine whether a GTO's object type is capable of being detected by a collection's sensor type. For example, a hyper-spectral sensor (HSI) is not capable of identifying objects by their shape (truck, car, tank, etc.) but only by their material properties such as metallic paint.

The randomization engine 102 can randomly select round ($d_i m_i$) GTOs from the eligible GTOs associated with the collection i. The randomly selected eligible GTOs are categorized as being true GTOs that were properly detected, and the object type for the respective selected GTOs is assigned to be the object type that was provided as input, such as via type input field 322 provided in FIG. 3. For each of the unselected eligible GTOs round$((1-d_i)m_i)$ that were not randomly selected (in other words were randomly unselected), these GTOs are categorized as being false alarm objects that were not properly detected.

Furthermore, in order to simulate misclassification of object types of similar objects, each input GTO can be associated with a similarity list. In embodiments, the similarity lists library 134 of the uncertainty library 130 can include a taxonomy of object types, which can be hierarchical classification tree that enables the randomization engine 102 to look up for an input object type a list of similar object types and randomly select an object type from the list of similar object types. Alternately, a similarity list of similar object types can be provided with data about an input GTO, e.g., via ground truths portion 300 of FIG. 3.

For each of the unselected eligible objects, the randomization engine 102 randomly selects an object type from the similarity list of similar object types and assigns the randomly selected object type to that eligible object. The similarity list can include the object type "none", in which case the GTO is not detected at all and is a missed detection. For object types other than "none", the detection becomes a false alarm since the detected object type does not correspond to the true object type. Regarding the false alarm rate $f_i$, which can be specified, for example, as a percentage or fraction, it gives a rate at which non-objects (e.g., background clutter and objects not of interest) are detected. These also represents false alarms as the ATR signals the presence of an object when there is none. $n_i$ represents a number of non-objects present in the collection i. In an example, when $n_i=100$ and $f_i=15\%$, 15 non-objects are detected as FAOs. A total number of false alarms can be determined as round($f_i n_i$).

Figure 8:
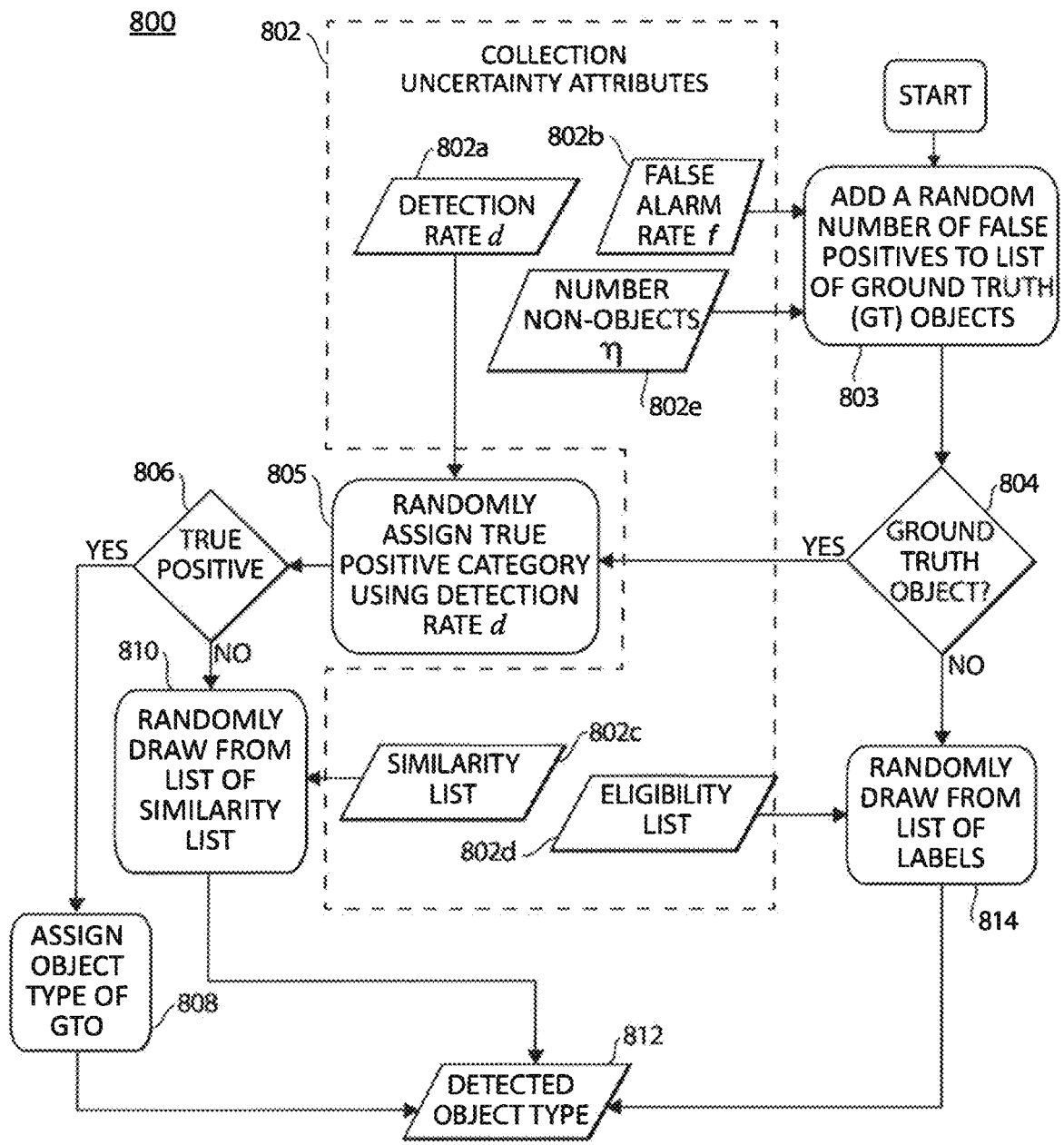
FIG. 8 shows a flowchart 800 of an example method of stochastically determining which of the GTOs (Ground Truth Objects) that are eligible for a collection are detected, and for determining object type labels of the detected and undetected GTOs.

For objects detected as false alarms (FAOs), the randomization engine 102 can randomly generates an object type from the list of eligible objects for collection i. As specified previously, the geo-location of these FAOs are also randomly generated by the randomization engine 102 using a uniform distribution that spans the entire area collected by the sensor in collection i. FIG. 8 shows a flowchart 800 of an example method of stochastically determining which of the GTOs that are eligible for a collection i are detected, and for determining object type labels of the detected and undetected GTOs. It also shows the stochastic generation of FAOs. Uncertainty attributes of the collection attributes 802 for collection i are received or randomly generated. These uncertainty attributes 802 can be input by a user, e.g., via input fields (not shown) provided on the collection portion 400 of GUI, or another processing device. The uncertainty attributes 802 include the true detection rate $d_i$ 802a, the false alarm rate $f_i$ 802b, a similarity list of similar ground truth objects 802c, an eligibility list of eligible objects 802d, and a number of a number $n_i$ 802e of non-objects present in the collection i. The similarity list can be an input list of object types or an identified list of object types, taxonomy, or portion of taxonomy included in similarity lists library 134 of the uncertainty library 130. The eligibility list can be a list of object types that are eligible to be detected by the collection i. The eligibility list can be an input list, a list of the object types of the eligible GTOs in GTO list 440, or selected from a library of eligibility lists library 136 of the uncertainty libraries 130.

At operation 803, the false alarm rate $f_i$ 802b and the number of non-objects $n_i$ 802e are processed to randomly add a number of objects, wherein the number is round($f_i n_i$), to the eligible GTOs listed in the GTO 440. In embodiments, the false alarm rate may also be randomly generated using a probability distribution specified for the collection in the uncertainty library. The added objects correspond to FAOs. The eligible GTOs and the added objects are referred to as eligible objects.

At operation 804, a determination is made for each of the eligible objects to determine whether it is designated FAO (in other words, it is not one of the GTO). If the determination at operation 804 is YES, meaning the eligible object corresponds to a GTO, then at operation 805, a random process is used to randomly assign the eligible object a true positive category. The random operation randomly selects round($d_i$, $m_i$) eligible objects to be assigned a true-positive detection category, meaning they are eligible objects that are properly detected. The remaining objects round(($1-d_i$)$m_i$) eligible objects are false positive (detected with a randomly assigned object type different from the true type) or a missed detection (assigned the "none" type and not included in the detections). In embodiments, the detection rate 802a may also be randomly generated using a probability distribution specified for the collection in the uncertainty library.

At operation 806 a determination is made whether the eligible object being processed was assigned a true-positive detection category. If the determination at operation 806 is YES, meaning the eligible object being processed has a true-positive detection category, then at operation 808 the eligible object is assigned its true object type, meaning the object type that was entered for the corresponding GTO at type input field 322 of portion 300 in FIG. 3. If the determination at operation 806 is NO, meaning the eligible object has not been detected properly (false alarm or missed detection), then at operation 810 the eligible object is assigned a randomly selected object type from the input similarity list 802c. Since the similarity list 802c can include an object-type of "none," if the object type "none" is randomly assigned to the eligible object, that eligible object is treated as not being detected at all. At operation 812, the assigned object type is output by the simulator 100 for the eligible object being processed. The output can be listed on the right side panel 403 of portion 400 of the GUI, used for determining whether or not to display a DGTO that corresponds to the GTO on the map 202 during playback, and/or output to the ADOS system 120 via a message.

At operation 814, a random process is performed to randomly draw an object type from the eligibility list 802d and assign the randomly drawn object type to the eligible object being processed. The object type 812 associated with the eligible object being processed is then output.

In embodiments, the randomization engine 102 can assign a confidence to each randomly generated detection j, wherein the detections/include objects that are detected as true objects (detected type is same as true type) or a false alarm (detected type is different from true type if it corresponds to a GTO or background is incorrectly detected as an object in the case of a FAO). The confidence is determined as:

$$c_j = \max(\min(N(c_j, \sigma_j^2), 1, 0),$$

which is determined using a Gaussian distribution N (other distributions known to those skilled in the art may be used as well) with mean $c_j$ and variance $\sigma_j^2$ for each detection j. The clipping operations with min and max operators are used to force the confidence to fall within the range [0 1]. The distribution properties ($c_j$ and $\sigma_j$) may be selected based on the eligible object that is being detected and/or whether the object is a true/false positive or a FAO. In a real-world setting, it may be easier to detect certain objects than others, which can be simulated by setting the $c_j$ for these objects to be relatively high.

Figure 9:
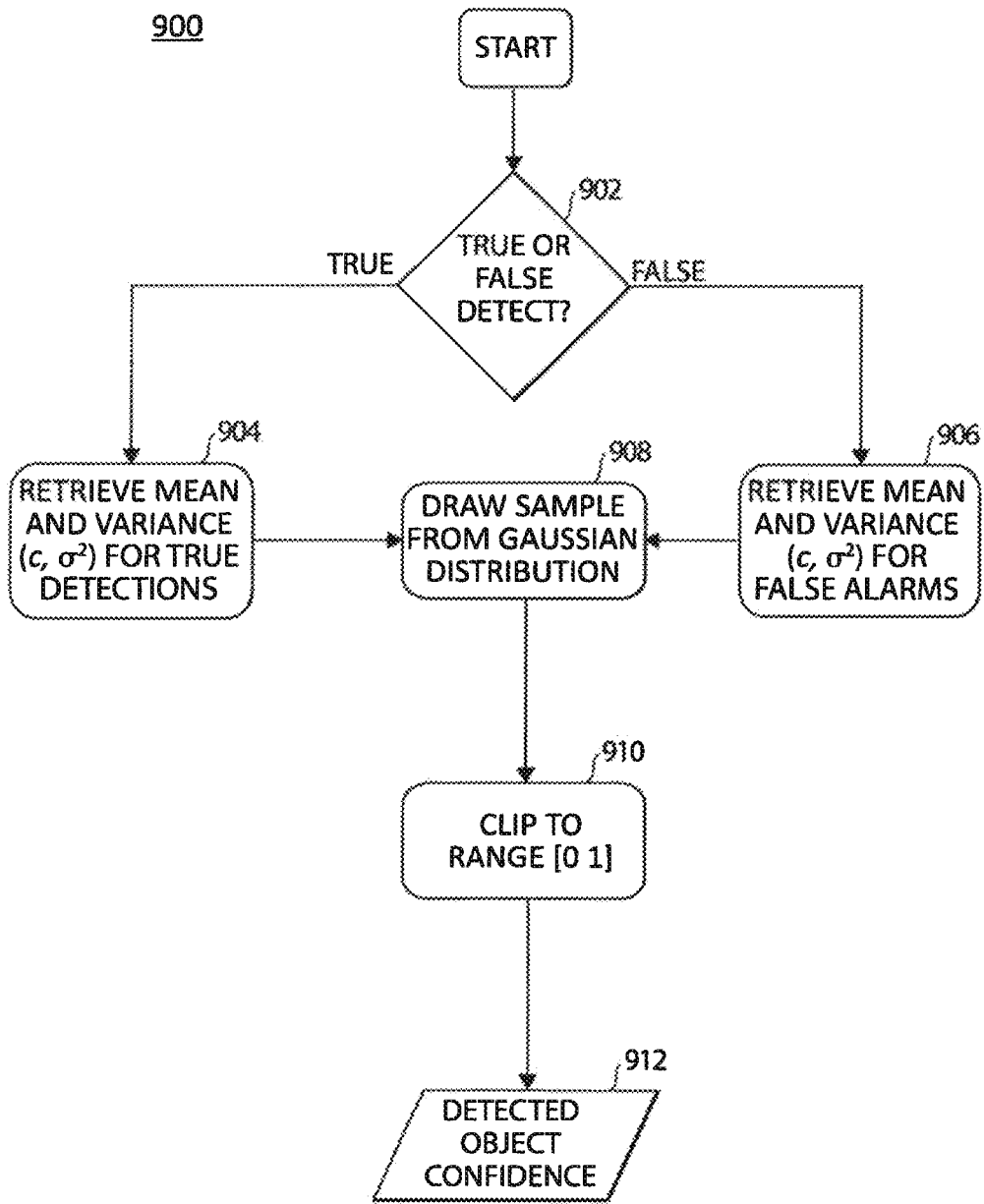
FIG. 9 shows a flowchart of an example method of assigning a confidence to a detection in accordance with embodiments of the disclosure.

In an example, $c_j$ and $\sigma_j$ are assigned based on whether the detection is a false alarm (misclassification by an ATR), wherein $c_j$ would be assigned a relatively low value, and $\sigma_j^2$ would be assigned a relatively high value. Example values for $c_j$ and $\sigma_j$ when assigned based on the detection category are shown below:

True positives: $c_j=0.85$, $\sigma_j=0.1$
False alarms: $c_j=0.5$, $\sigma_j=0.25$ FIG. 9 shows a flowchart 900 of an example method of assigning a confidence to a detection in accordance with an embodiment in which the distribution properties (c and σ) for determinant confidence are determined based on whether the detection is a true detection or a false alarm. The uncertainty library 130 includes a confidence distribution properties library 138 that associates a first set of distribution properties (c and σ) to true detections and a second set of distribution properties (c and σ) to false alarms.

The method is applied to each detection, whether it is a true detection or a false alarm. At operation 902, a determination is made, for the detection being processed, whether the detection is a true detection or a false alarm. When the determination at operation 902 is that the detection is a true detection, the method continues at operation 904. At operation 904, the distribution properties (c and σ) associated with true detections is assigned to the detection being processed. When the determination at operation 902 is that the detection is a false detection, the method continues at operation 906. At operation 906, the distribution properties (c and σ) associated with false alarm detections is assigned to the detection being processed.

Following performance of either operation 904 or 906, the method continues at operation 908. At operation 908, a sample is drawn from a Gaussian distribution N using mean c and variance σ. At operation 910, the output of operation 908 is clipped to fit in a range [0,1]. The detected object confidence 912, output from operation 910 for the detection being processed, is output by the simulator 100. The output detected object confidence 912 can be used for displaying the detection on the map 202 during playback (such as to affect the graphic display of the detection or to be displayed as metadata when the detection is selected or pointed at when hovering with a pointing device), and/or output to the ADOS system 120 via a message.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments processing performed by the simulator 100 may be implemented or executed by one or more computer systems. For example, processing performed by the simulator 100 can be implemented using a computer system such as example computer system 1002 illustrated in FIG. 10. In various embodiments, computer system 1002 may be a server, a mainframe computer system, a workstation, a network computer, a desktop computer, a laptop, or the like, and/or include one or more of a field-programmable gate array (FPGA), application specific integrated circuit (ASIC), microcontroller, microprocessor, or the like.

Computer system 1002 is only one example of a suitable system and is not intended to suggest any limitation as to the scope of use or functionality of embodiments of the disclosure described herein. Regardless, computer system 1002 is capable of being implemented and/or performing any of the functionality set forth hereinabove.

Computer system 1002 may be described in the general context of computer system-executable instructions, such as program modules, being executed by a computer system. Generally, program modules may include routines, programs, objects, components, logic, data structures, and so on that perform particular tasks or implement particular abstract data types. Computer system 1002 may be practiced in distributed data processing environments where tasks are performed by remote processing devices that are linked through a communications network. In a distributed data processing environment, program modules may be located in both local and remote computer system storage media including memory storage devices.

Figure 10:
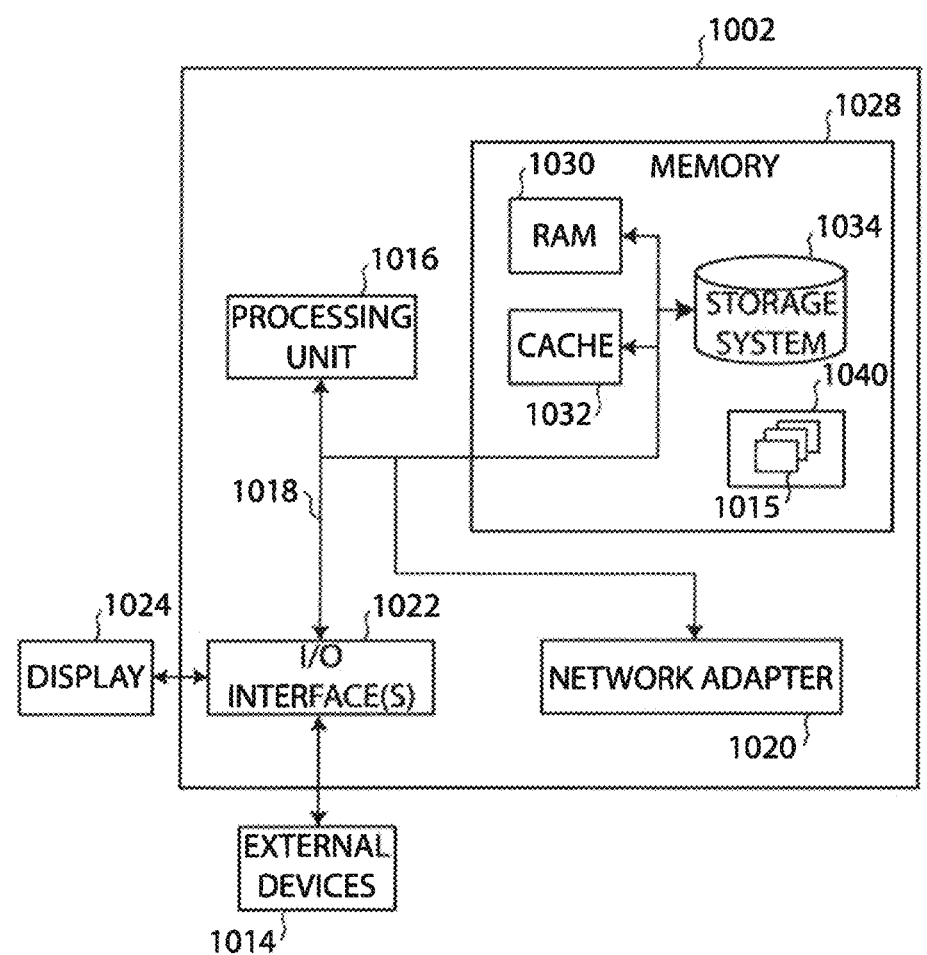
FIG. 10 shows a block diagram of an exemplary computer system configured to implement the simulator in accordance with embodiments of the disclosure.

Computer system 1002 is shown in FIG. 10 in the form of a general-purpose computing device. The components of computer system 1002 may include, but are not limited to, one or more processors or processing units 1016, a system memory 1028, and a bus 1018 that couples various system components including system memory 1028 to processor 1016.

Bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 1002 typically includes a variety of computer system readable media. Such media may be any available media that is accessible by the simulator 100, and it includes both volatile and non-volatile media, removable and non-removable media.

System memory 1028 can include computer system readable media in the form of volatile memory, such as random access memory (RAM) 1030 and/or cache memory 1032. Computer system 1002 may further include other removable/non-removable, volatile/non-volatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1018 by one or more data media interfaces. As will be further depicted and described below, memory 1028 may include at least one program product having a set (e.g., at least one) of program modules that are configured to carry out the functions of embodiments of the disclosure.

Program/utility 1040, having a set (at least one) of program modules 1015 may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1015 generally carry out the functions and/or methodologies of embodiments of the disclosure as described herein.

Computer system 1002 may also communicate with one or more external devices 1014 such as a keyboard, a pointing device, a display 1024, etc.; one or more devices that enable a user to interact with computer system 1002; and/or any devices (e.g., network card, modem, etc.) that enable the simulator 100 to communicate with one or more other computing devices. Such communication can occur via Input/Output (I/O) interfaces 1022. Still yet, computer system 1002 can communicate with one or more networks such as a local area network (LAN), a general wide area network (WAN), and/or a public network (e.g., the Internet) via network adapter 1020. As depicted, network adapter 1020 communicates with the other components of the simulator 100 via bus 1018. It should be understood that although not shown, other hardware and/or software components could be used in conjunction with computer system 1002. Examples, include, but are not limited to: microcode, device drivers, redundant processing units, external disk drive arrays, RAID systems, tape drives, and data archival storage systems, etc.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the illustrated embodiments, exemplary methods and materials are now described. All publications mentioned herein are incorporated herein by reference to disclose and describe the methods and/or materials in connection with which the publications are cited.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

It is to be appreciated the embodiments of the disclosure include software algorithms, programs, or code that can reside on a computer useable medium having control logic for enabling execution on a machine having a computer processor. The machine typically includes memory storage configured to provide output from execution of the computer algorithm or program.

As used herein, the term "software" is meant to be synonymous with any code or program that can be in a processor of a host computer, regardless of whether the implementation is in hardware, firmware or as a software computer product available on a disc, a memory storage device, or for download from a remote machine. The embodiments described herein include such software to implement the logic, equations, relationships and algorithms described above. One skilled in the art will appreciate further features and advantages of the illustrated embodiments based on the above-described embodiments. Accordingly, the illustrated embodiments are not to be limited by what has been particularly shown and described, except as indicated by the appended claims.

A potential advantage of the various embodiments of the simulator 100 disclosed is the ability to simulate random behavior of sensors and ATRs; receive input to simulate different scenarios, objects available for detection, and aspects of the random behavior of the sensors and ATRs; graphically display the simulated output; provide the simulated output to an ADOS system, which could not be previously obtained without performing exercises using actual targets, sensors, and ATRs.

While shown and described in the exemplary context of ground target detection related applications, those skilled in the art will readily appreciate that the simulator 100 in accordance with this disclosure can be used in any other suitable application, including autonomous driving or for robotics or purposes other than military applications.

While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A method of providing a graphical user interface (GUI) for simulating target detection and recognition, the method comprising:
   providing a user entry area for receiving user-entered ground truth attributes defining one or more respective simulated physical objects;
   providing a user entry area for receiving user-entered collection attributes associated with one or more collections for defining one or more collections, each collection being a simulation of automated target recognition applied to simulated sensor output associated with simulated sensing of the one or more simulated physical objects by a plurality of simulated sensors, wherein the collection attributes include uncertainty attributes that represent uncertainty associated with detection of a geolocation of the respective one or more simulated physical objects, wherein the uncertainty attributes indicate uncertainty of pointing knowledge of one or more simulated sensors of the plurality of simulated sensors;
   applying at least one stochastic algorithm to the uncertainty attributes;

simulating detection of the one or more simulated physical objects at a geolocation at a point in time and recognition based on the ground truth attributes, the collection attributes, the uncertainty attributes, and a result of the at least one stochastic algorithm;

generating detection data about at least one detected object based on the simulated detection; and displaying the detection data.

2. The method as recited in claim 1, further comprising outputting the detection data to a processing device that receives detection data as simulated automatic target recognition data and makes autonomous tactical determinations using real or simulated automatic target recognition data.

3. The method as recited in claim 1, wherein displaying the detection data includes displaying the detection data relative to a map of a scenario of the simulation.

4. The method as recited in claim 3, further comprising providing a user entry area for receiving scenario input, the scenario input including a map, a region of interest relative to the map, and a time of interest that defines a start and end time for simulation of the target detection.

5. The method as recited in claim 1, further comprising providing a user entry area for controlling playback of the displayed detection data.

6. The method as recited in claim 5, wherein the user entry area for controlling playback of the displayed detection data includes a user entry area for receiving user-entered selections that determine whether or not to display at least one of ground truths defined by the ground truth attributes, detected objects that correspond to the ground truths, and detected objects that are false alarms and do not correspond to the ground truths.

7. The method as recited in claim 1, wherein:
simulating the target detection includes determining an object type of each of the detected objects,
the detection data includes geolocation data and object type data associated with the detected geolocation and object type, respectively, of the respective detected objects, and
displaying the detection data includes displaying at least one of the geolocation and object type of each of the detected objects.

8. The method as recited in claim 1, wherein the method further comprises providing a map interface that streams imagery from the map.

9. The method as recited in claim 8, wherein the map interface receives user input for selecting a region of interest of the simulation.

10. The method as recited in claim 8, wherein the map interface includes at least a portion of the user entry area for receiving the user-entered ground truth attributes.

11. The method as recited in claim 1, wherein:
the detection data includes geolocation data associated with a detected geolocation of the respective detected objects, and
the method further comprises
displaying the detection data includes displaying the detected object using its associated geolocation data.

12. The method as recited in claim 11, further comprising applying an interpolation function to determine a geolocation associated with at least one respective selected time, wherein displaying the detection data includes displaying the detected object at the at least one selected time using the associated geolocation.

13. The method as recited in claim 12, wherein:
the at least one uncertainty attribute includes a random error covariance, and the method further comprises using a geolocation determined in association with a selected time of the at least one selected time to draw at least one sample from a probability distribution that applies the random error covariance to cause the geolocation of the detected object associated with the at least one respective selected time to be generated as a random geolocation.

14. The method as recited in claim 13, wherein the at least one uncertainty attribute includes a bias covariance, and
the method further comprises drawing a zero-mean sample from a second probability distribution that applies the bias covariance,
wherein the geolocation determined for the detected object associated with the at least one respective selected time is randomly offset based on a result of drawing the zero-mean sample.

15. The method as recited in claim 1, wherein:
the at least one uncertainty attribute further includes a time decorrelation parameter,
wherein the collection attributes associated with a collection indicate whether the simulated sensing by the simulated sensors is single-frame or multi-frame, and
when the collection attributes associated with the collection indicate that the simulated sensing is multi-frame, the method further comprises:
applying an interpolation function to interpolate multiple geolocations of the detected object at different times associated with the collection at uniform time intervals specified by the time decorrelation parameter; and
using an interpolated position of the multiple interpolated positions to draw the at least one sample from the probability distribution that applies the random error covariance.

16. The method as recited in claim 1, wherein:
the ground truth attributes specify an object type in association with the respective simulated physical objects,
the detection data includes the detected object type and the detected objects are displayed in association with their respective detected object types, and
the method further comprises:
determining the detected object type by using the at least one stochastic algorithm; and
categorizing the one of the detected objects as a false alarm when the detected object type of the detected object is different than an object type of the ground truth attributes specified for a corresponding simulated physical object.

17. The method as recited in claim 1, wherein:
the method further comprises determining whether or not one of the simulated physical objects is simulated to be detected based on the at least one uncertainty attribute, and
wherein displaying the detection data includes only displaying detection data for a detected object if it corresponds to a simulated physical object that was determined to be detected.

18. The method as recited in claim 10, wherein:
the collection attributes defining a false detection rate,
the method further comprises:
adding a random number of false detections that do not correspond to information in the ground truth attributes using the at least one stochastic algorithm that applies the false detection rate; and
assigning the detected object type for each of the false detections to be a randomly drawn object type from an eligibility list of object types indicated to be eligible to be detected by the collection,
wherein displaying the detection data includes displaying an object that corresponds to each to the false detections in association with the detected object type assigned for that false detection.

19. The method as recited in claim 1, further comprising providing a user entry for receiving a user-entered false alarm object to be included in the collection attributes associated with a collection of the one or more collections, wherein the false alarm object does not correspond to simulated detection of any of the one or more simulated physical objects defined by the ground truth attributes,
wherein displaying the detection data includes displaying an object that corresponds to the false-alarm object.

20. A non-transitory computer readable storage medium having one or more computer programs stored therein associated with multiple layers of a tactical information system, the computer programs associated with each layer comprising instructions, which when executed by a processor of a computer system, cause the processor to:
provide a user entry area for receiving user-entered ground truth attributes defining one or more respective simulated physical objects;
provide a user entry area for receiving user-entered collection attributes associated with one or more collections for defining one or more collections, each collection being a simulation of automated target recognition applied to simulated sensor output associated with simulated sensing of the one or more simulated physical objects by a plurality of simulated sensors, wherein the collection attributes include uncertainty attributes that represent uncertainty associated with detection of a geolocation of the respective one or more simulated physical objects, wherein the uncertainty attributes indicate uncertainty of pointing knowledge of one or more simulated sensors of the plurality of simulated sensors;
apply at least one stochastic algorithm to the uncertainty attributes;
simulate detection of the one or more simulated physical objects at a geolocation at a point in time and recognition based on the ground truth attributes, the collection attributes, the uncertainty attributes, and a result of the at least one stochastic algorithm;
generate detection data about at least one detected object based on the simulated detection; and
display the detection data.

* * * * *